United States Patent [19]

Kaida

[11] Patent Number: 5,222,031
[45] Date of Patent: Jun. 22, 1993

[54] LOGIC CELL PLACEMENT METHOD FOR SEMICONDUCTOR INTEGRATED CIRCUIT

[75] Inventor: Hiromasa Kaida, Chiba, Japan

[73] Assignee: Kabushiki Kaisha Toshiba, Kawasaki, Japan

[21] Appl. No.: 658,406

[22] Filed: Feb. 20, 1991

[30] Foreign Application Priority Data

Feb. 21, 1990 [JP] Japan ............... 2-038265

[51] Int. Cl.⁵ .......................... G06F 15/60
[52] U.S. Cl. .................. 364/491; 364/490; 364/489; 364/488
[58] Field of Search ............ 364/488, 489, 490, 491

[56] References Cited

U.S. PATENT DOCUMENTS

| | | | |
|---|---|---|---|
| 3,654,615 | 4/1972 | Freitag | 364/491 |
| 4,615,011 | 9/1986 | Linsker | 364/491 |
| 4,630,219 | 12/1986 | DiGiacomo et al. | 364/491 |
| 4,636,966 | 1/1987 | Yamada et al. | 364/491 |
| 4,688,072 | 8/1987 | Heath et al. | 364/491 |

*Primary Examiner*—Vincent N. Trans
*Attorney, Agent, or Firm*—Foley & Lardner

[57] ABSTRACT

A logic cell placement method for a semiconductor circuit includes a cluster pair generating and calculating step for forming a cluster pair made up of any two clusters when there are more than three clusters, each of which comprises at least one logic cell. The calculating method includes estimate values of each cluster pair by using estimate functions based on a congestion rate of the number of wirings on the cluster pair. The method also includes an upper limit setting step for calculating cost values by using the estimate values for each cluster pair, mean values of the cost values and the estimate values for the whole cluster pairs, then setting the upper limit of for each estimate value obtained by using the mean values of the estimate values. A selecting step selects the cluster pair having the smallest cost value. A calculating step calculates estimate values of the cluster pair having the smallest cost value by using the estimate functions based on the congestion rate of the number of wirings, a clustering step for clustering the pair into one cluster when all of the estimate values of the cluster pair having the smallest cost value are less than the upper limits thereof. The current process is returned into the selecting step when there are two clusters which are not handled by the clustering step. The current process is returned into the cluster pair generating and calculating step when a terminate condition for the logic cell placement method is not satisfied.

4 Claims, 2 Drawing Sheets

LOGIC CELL PLACEMENT METHOD FOR SEMICONDUCTOR INTEGRATED CIRCUIT

BACKGROUND OF THE INVENTION

1. Field of the Invention

This invention relates to a method of logic cell placement for an automatic layout system with which logic cells are arranged on a semiconductor circuit, and more particularly to a method for generating clusters formed by interconnecting logic cells.

2. Description of the Prior Art

Because of the rapid progress of fine fabrication technology for Very Large Scale Integration (VLSI) circuits in recent years, VLSI circuits can be fabricated using such fine fabrication technology.

Many automatic layout systems have been developed in efforts to reduce chip area of VLSI and the amount of computer time for arranging logic cells on a semiconductor chip. A three-stage arrangement method is the most commonly used automatic layout system. The three-stage arrangement method is divided into a pretreatment process, an initial arranging process, and an arrangement improvement process.

In the pretreatment process, a cluster is formed with a group of logic cells which have strong connection strengths to each other, but weak external connections to other groups. In the initial arranging process, the clusters are arranged on the semiconductor chip temporarily. In the arrangement improvement process, the position of the cluster arranged by the initial arranging process is changed for improved arrangement.

Where the three-stage arrangement method is used as the automatic placement method, the better the result of the earlier process is, the more the arrangement of the logic cells finally obtained is effected.

Therefore it is important to get very good results in the earlier process so as to optimize chip area.

A clustering method for grouping logic cells is usually used in the pretreatment process. There are two reasons for this.

The first reason is that the clustering method can reduce the total processing time or the amount of computer time for arranging the logic cells on the chip. Namely, the cluster is used as one logic cell, so that the number of objects for calculation of arranging in the method becomes smaller than where the clustering method is not used.

The second reason is that logic cells having a strong connection strength or a strong relation to one another are collected into a cluster by the clustering method so that wiring lengths between the logic cells can be reduced.

In conventional clustering methods, two calculation methods are generally well known.

In the first calculation method for clustering logic cells, cells having a strong connection strength are grouped so as to generate a cluster based on the strong connections of signals to be transferred among the logic cells. In such a case, the connection strength between the clusters is given by the following equation:

CONNECTION STRENGTH =

$$Cab \times ((1/(Ca - Cab)) + (1/(Cb - Cab)))$$

where:

Cab: the number of wirings connected between clusters A and B;

Ca: the number of wirings connected between the cluster A and clusters other than the cluster A in the cluster A; and Cb: the number of wirings connected between the cluster B the clusters other than the cluster B in the cluster B.

A well known reference about the calculation method for clustering is Donald M. Schuler and Ernest G. Ulrich, "CLUSTERING AND LINEAR PLACEMENT", Proceedings of 9th Annual Design Automation Workshop, pp.50–56, 1972.

In one step for generating a cluster in this method, an upper limit of an area of the cluster is used, so as to simplify handling of the clusters. Moreover an upper limit of the number of logic cells per cluster is also used for each wiring between the clusters as restrictions in the initial arrangement process.

In a second method logic cells having a similar function are grouped by utilizing a hierarchy structure of a net list.

However, detailed information such as the number of terminals in each cluster, the number of wirings which can be wired on a logic cell, and the size of a logic cell in the cluster are not considered in the conventional clustering methods described above. Accordingly, the degree of possibility for wiring in each cluster is different to each other.

A cluster having many terminals is generated by the unbalance of the number of terminals among clusters, so that an area with crowded wirings in the cluster is supplied.

A cluster having a small number of wirings which can be wired on a logic cell is generated by the unbalance of the number of wirings which can be wired on each cluster.

Accordingly, when a wiring is required in an area around the cluster, it is necessary that a cell only used for wiring, or a field through cell, be inserted next to the cluster or the wiring to be wired around the cluster should be wired around it.

These can become a main cause for increasing the length of a cell block or a width of a channel.

A cluster having many small logic cells is generated by an unbalance or size of logic cell area among clusters, so that a difference in the number of terminals or wirings which can be wired on a logic cell occurs among the clusters.

FIG. 1 shows a schematic diagram for explanation of a cluster having many small logic cells such as a NAND circuit, a NOR circuit, or IV (inverter) circuit (where only one wiring can not wired) centered in an area. Namely, only one wiring can not be wired on the small logic cell. While many wirings are wired on a large logic cell having almost the same number of terminals as the small logic cell.

In the same diagram, reference number 1 denotes a logic cell as the small logic cell having no wiring thereon, reference number 2 designates a logic cell having two wiring thereon as the large logic cell, and reference number 3 designates wiring on the logic cell 2.

As clearly shown in FIG. 1, where there are wirings around the small logic cell 1, the wirings must be wired round it or on the field through cell as a dummy logic cell is incorporated next the small logic cell 1 so that the width of the block relating to the small logic cell or the number of tracks should be increased for the wirings.

SUMMARY OF THE INVENTION

An object of the present invention is to provide a logic cell placement method by which congestion rates of the number of wirings between clusters can be almost equaled so as to efficiently arrange logic cells on a semiconductor integrated circuit.

In order to achieve the object, a logic cell placement method for a semiconductor circuit according to the present invention includes a cluster pair generating and calculating step. In this step is a cluster pair, made up of any two clusters when there are more than three clusters each of which comprises at least one logic cell is formed. Estimate values of each cluster pair are calculated by using estimate functions based on a congested rate of the number of wirings on the cluster pair. An upper limit setting step for calculating cost values uses the estimate values for each cluster pair, mean values of the cost values and the estimate values for the whole cluster pairs, then sets the upper limit for each estimate value obtained by using the mean values of the estimate values. A selecting step selects the cluster pair having the smallest cost value. A calculating step calculates estimate values of the cluster pair having the smallest cost value by using the estimate functions based on the congested rate of the number of wirings. A clustering step clusters the cluster pair into one cluster when all of the estimate values of the cluster pair having the smallest cost value are not more than the upper limits thereof. A feedback step returns the current process to the selecting step when there are two clusters which are not handled by the clustering step and returns the current process to the cluster pair generating and calculating step when a terminate condition for the logic cell placement method is not satisfied.

The number of terminals in a cluster pair, the number of wirings which can be wired on logic cells in a cluster, and a function whose value is decreased in accordance with an increase of an area of a logic cell in a cluster are used as estimate functions based on the congestion rate of the number of wirings in each cluster pair in the embodiment according to the present invention.

By using the logic cell placement method, the congestion rate of the number of wirings in each cluster is relatively uniform such that many small logic cells centered in the small area on the semiconductor substrate can be avoided. Moreover, the use of the field-through cells as dummy cells only used for signal wirings can be avoided. Furthermore, increasing the number of tracks can be eliminated by using the logic cell placement method according to the present invention.

This object, feature and advantages of the present invention will be more apparent from the following description of a preferred embodiment, taken in conjuction with the accompanying drawings.

DETAILED DESCRIPTION OF THE EMBODIMENTS

Figure 1:
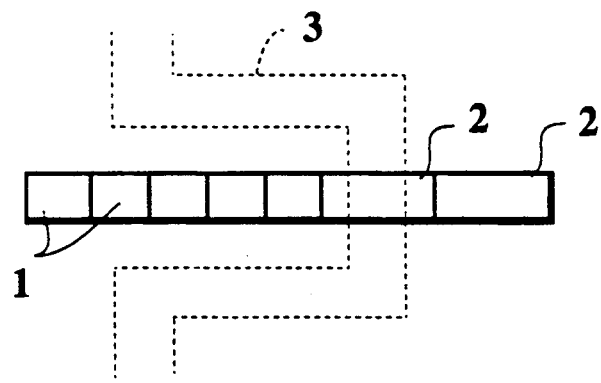
FIG. 1 is a diagram showing a part of resultant layout of logic cells on a semiconductor integrated circuit obtained by a conventional logic cell placement method.

An embodiment of the present invention will now be described with reference to FIGS. 2, 3, and 4.

In the embodiment, a cluster includes at least one logic cell. A cluster pair is made up of any two clusters. The distribution of the number of terminals in the cluster pair, the distribution of the number of wirings which can be wired on the logic cells in the cluster pair, and the area of the logic cells in the cluster pair are used as estimate functions. A cluster pair is formed only when estimate values of the cluster pair calculated by the following equations are more than the upper limits. If at least one estimate value is not more than it's upper limit, a new cluster pair can not be generated.

The estimate functions are defined as follows:

(1) In an estimate function Fc of a connection strength of a cluster pair, Xi is the connection degree of the cluster pair, one cluster in the cluster pair is designated by a reference character A and the other is B, CONNECTION STRENGTH $Fc =$ $$Cab \times ((1/(Ca - Cab)) + (1/(Cb - Cab)))$$

where Cab is the number of wirings for connecting clusters A and B, Ca is the number of wirings which connect clusters other than the cluster A, Cb is the number of wirings which connect clusters other than the cluster B, and Net-size is the number of terminals at which one signal is transferred.

In the calculation of the estimation function of the connecting strength of the cluster pair, each Cab, Ca, and Cb is multiplied by a weight which is proportional to $(1/Net\text{-}size)^2$ according to each cluster.

(2) In the calculation of an estimate function Fa, xi is the area of the cluster pair including clusters A and B This area is obtained by the sum of the area of the cluster A and the area of the cluster B.

(3) In the calculation of an estimate function Fp, xi is used as the number of terminals of the cluster pair including cluster A and B. This is defined by the sum of the number in terminals of the clusters A and B.

(4) In the calculation of an estimate function Fr, xi is the number of wirings which can be wired on the logic cells of the cluster pair including the clusters A and B. The number of wirings is obtained by the sum of wirings which can be wired on the logic cells in the clusters A and B, respectively.

(5) In the calculation an estimate function Fw, xi is the sum of the values which decrease in accordance with the increase of an area of each cluster pair including the clusters A and B.

The sum of the values which decrease in accordance with an increase in an area of each cluster pair is used in the present embodiment, so as to avoid the formation of a cluster pair having many logic cells of small size.

The estimate functions Fp, Fr, and Fw are defined in consideration of the congestion rate of the number of wirings on the cluster.

In the estimate functions defined above, estimate values fc, fa, fp, fr, and fw obtained by the estimate functions Fc, Fa, Fp, Fr and Fw are calculated as the following equation:

$$fx = Fx(X) = -Fx(-X) = X^3$$

$$FX'(X) \leq 0$$

where x means c, a, p, r, and w.

This equation is an odd function, whose value increases monotonically. Fx is one of the estimate functions, Fc, Fa, Fp, Fr, and Fw. fx is one of the estimate values fc, fa, fp, fr, and fw.

Where $x = Xi -$ the mean value of each estimate value per cluster pair, Xi is an estimate value of each cluster pair, and the mean value $= \Sigma Xi /$ the number of cluster pairs.

As described above, because the difference between the mean value of each estimate function's value of the cluster and itself can be amplified, the quality of the cluster can be controlled, so as to equal that of another cluster when the difference is used as an index designated to the clusterization of the cluster.

The calculation steps of the logic cell placement method of the embodiment will now be explained. FIG. 2 is a flow chart explaining the process of the logic cell placement method according to the present invention. FIG. 3 shows the relationship among clusters which are used in the flow chart as shown in FIG. 2.

In the same diagram, a reference number 4 designates a cluster and 5 denotes wiring for connecting between the clusters.

First, in a step P1, the estimate values such as fc, fa, fp, fr, and fw of each cluster pair in which one cluster is directly connected to another cluster are calculated.

Figure 3:
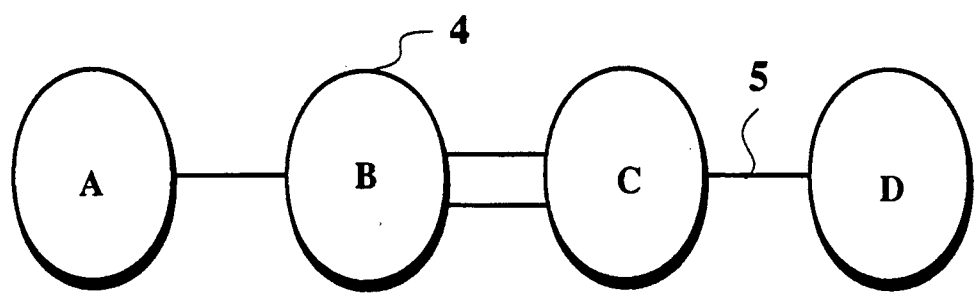
FIG. 3 is a relationship among logic cell so as to explain the processes of the logic cell placement method as shown in FIG. 2.

The estimate values of each cluster pair, as shown in FIG. 3, are calculated. For example, the estimate value fc of the cluster pair including the clusters B and C is obtained as follows:

$$\begin{aligned} fc = F(X) &= X^3 \\ &= (4-5)^3 \\ &= -1 \end{aligned}$$

Where the mean value of fc is 5, the number of wirings connected between the clusters A and B is $2/2^2$, and therefore the connection strength of the cluster pair is shown as following:

$$fc = 2/2^2 \times (1/(\tfrac{1}{2}^2) + 1/(\tfrac{1}{2}^2)) = 4.$$

Similarly, the estimate values of the other cluster pairs, pairs of the cluster B and C, and the clusters C and D are calculated in the step 1.

Next, cost values c1 and c2 of each cluster pair is calculated in a step P2 as follows:

$$c1 = -\alpha \times fc + \beta \times fa,$$

$$c2 = \gamma \times fp - \delta \times fr + \epsilon \times fw$$

where $\alpha, \beta, \gamma, \delta,$ and $\epsilon$ are fixed parameters which are determined experimentally.

The cost value c2 is obtained in consideration of the congestion rate of the number of wirings on th cluster in the step P2.

The cluster pair having the smallest cost value c2 is selected in step P3.

In step P4, the estimate values, fc, fa, fp, fr, and fw of the selected cluster pair in the step P2 are calculated again for clustering the selected cluster pair into one cluster.

In step p4, the upper limit of each estimate value according to the estimate function is set in consideration of the mean value of the estimate value.

Next, only when all of the estimate values of the cluster pair are less than their upper limits, the cluster pair is clustered into one cluster, as shown in steps P5 and P6. When the estimate values of the cluster pair are not less than the upper limits, the cluster pair is not clustered.

In the present embodiment, one (1) is used as the upper limit of each estimate value based on the result of the simulation according to the estimate functions.

To summarize the above described steps, for example, when there are cluster pairs A and B, and A and C, which are in the order of clusterization, the following steps are carried out about the cluster pair A and B having the highest clusterization order.

By using the area of the cluster pair, the number of terminals of the cluster pair, the number of wirings which can be wired on the logic cells in the cluster pair, and the reciprocal value of the area of the cluster pair A and B, the estimate values fc, fa, fp, fr, and fw of the cluster pair A and B are calculated in step P1.

Where the estimate values of the cluster pair A and B are less than the upper limits thereof, the cluster pair A and B is clustered into a new cluster A' (P5 and P6).

In step P7, the current process is fed back to the step P2 because the clusters A' and C may be clustered.

Next, a new cluster pair A' and C is formed, then its area, the number of terminals, the number of wirings of the cluster pair A' and C, and a reciprocal value of the area are calculated by using the estimate functions.

When the estimate values of the new cluster pair calculated by step P4 are less than the upper limits thereof, the clusters A' and C are clustered into one cluster in step P6.

Thus, the process for clustering is closed because there is no cluster for clusterization in step P8.

The series of steps as described above is executed repeatedly until a final condition is achieved.

In step P8, the number of clusters or the number of repetitions of the process can be also used as the final condition.

As described above, by using the logic cell placement method, the congestion rate of the number of wirings in each cluster is more uniform such that many small logic cells centered in a small area on the semiconductor substrate can be avoided. Moreover, the use of field-through cells as cells only used for signal wirings can be avoided. Furthermore, increases in the number of tracks can be eliminated by using the logic cell placement method according to the present invention.

Table 1 shows the results of a conventional logic cell placement method and the logic cell placement method according to the present embodiment in which approximately 3,000 logic cells are used for the calculation thereof.

As clearly shown in Table 1, the standard deviation of each estimate function obtained by the logic cell placement method of the present invention is smaller than that of the conventional logic cell placement method.

Therefore the variation of each estimate value obtained by the present invention is narrow.

As clearly shown in Table 2, the wiring length obtained by the present invention decreases to approximately 92% of that of the conventional method and the chip area of the former decreases to approximately 95% of the latter.

TABLE 1

|  | conventional method | present invention |
|---|---|---|
| THE NUMBER OF WIRINGS WHICH CAN BE WIRED ON A LOGIC CELL | 5.4* | 3.5* |
| THE NUMBER OF TERMINALS | 2.6* | 1.4* |
| 1/AREA | 13.6* | 4.2* |

*STANDARD DEVIATION

TABLE 2

|  | conventional method | UNIT: % present invention |
|---|---|---|
| THE RATE OF WIRING LENGTH | 100 | 92.0 |
| THE RATE OF AREA | 100 | 95.3 |

Figure 4:
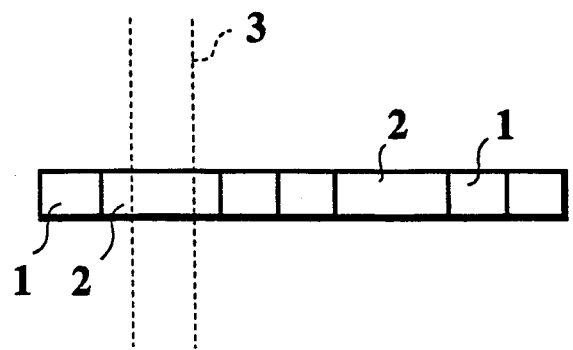
FIG. 4 is a diagram showing a part of resultant layout of logic cells on a semiconductor integrated circuit obtained by the logic cell placement method as shown in FIG. 2.
Figure 2:
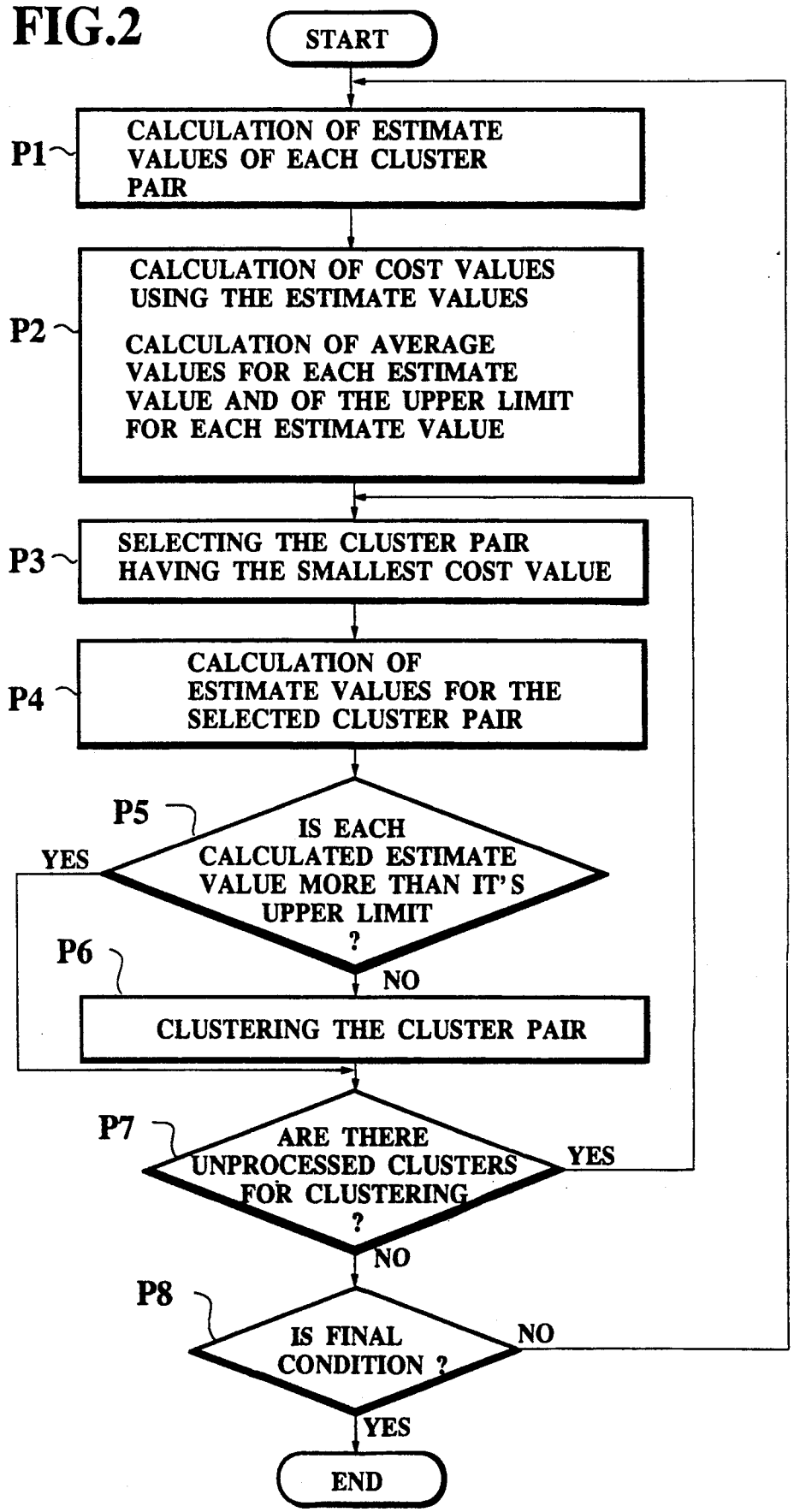
FIG. 2 is a flow chart showing processes of a logic cell placement method according to the present invention.

FIG. 4 is a diagram showing a part of a resultant layout of logic cells on a semiconductor integrated circuit obtained by the logic cell placement method according to the present invention, as shown in FIG. 2.

By using the logic cell placement method, the number of tracks on the chip, as shown in FIG. 1, can be reduced as shown in FIG. 4 and therefore the degree of integration can be increased.

The invention is not limited to the specific embodiment described but various modifications will become possible for those skilled in the art after the teaching of the present disclosure without departing from the scope thereof.

For example, when a logic cell is transferred or changed to another logic cell in a mini-cutting process, the logic cell placement method of the present invention can be employed by using the estimate functions, Fc, Fa, Fp, Fr, and Fw. In addition, this method may be also used for selecting a logic cell for a transfer or a change operation.

Moreover, in a process for arranging logic cells on areas divided by many cutting lines on a chip, the estimate functions can be also used as the limitation condition among the areas.

What is claimed is:

1. A logic cell placement method for arranging clusters on a semiconductor circuit, each cluster having at least one logic cell, the method being implemented by a computer aided design system, comprising the steps of:
   (a) forming pairs of clusters when there are more than three clusters, each cluster having at least one logic cell, and determining estimate values of each cluster pair by using estimate functions based on a congestion rate of the number of wirings on said cluster pairs;
   (b) determining cost values using said estimate values for each said pair of clusters, determining mean values of the cost values and estimate values for all said cluster pairs, then setting an upper limit for each estimate value obtained using said mean values of said estimate values;
   (c) selecting the cluster pair having the smallest cost value;
   (d) determining estimate values of the cluster pair having the smallest cost value by using said estimate functions based on said congestion rate of the number of wirings;
   (e) clustering said cluster pair having the smallest cost value into one cluster when all of the estimate values of said cluster pair having the smallest cost value are less than upper limits thereof;
   (f) returning to step (c) when there are at least two clusters which are not clustered into said one cluster in step (e);
   (g) returning to step (a) when a terminate condition for said logic cell placement is not satisfied.

2. A logic cell placement method according to claim 1, wherein a connection strength of each cluster pair, the number of terminals of each cluster pair, the number of wirings which can e wired on the logic cells of each cluster pair, and a sum of values increasing in accordance with an increase of the area in the cluster pair are used as the estimate functions based on the congested rate of the number of wirings.

3. A logic cell placement method for arranging clusters, each cluster having at least one logic cell on a chip of a semiconductor integrated circuit, the method being used for a computed aided semiconductor design process and comprising:
   a cluster pair generating and calculating step for forming a pair of clusters when there are more than three clusters, each cluster having at least one logic cell, and for calculating estimate values of each cluster pair by using estimate functions based on a congestion rate of the number of wirings on the cluster pair;
   an upper limit setting step for calculating and storing in the computer cost values by using the estimate values for each cluster pair, mean values of the cost values and the estimate values for all the cluster pairs, and an upper limit for each estimate value obtained by using the mean values of the estimate values;
   a calculating step for calculating estimate values of the cluster pair having the smallest cost value stored in the computer by using the estimate functions based on the congestion rate of the number of wirings;
   a clustering step for clustering the pair of clusters into a new cluster when all of the estimate values of the pair of clusters having the smallest cost value stored in the computer are less than the upper limits thereof;
   a step of returning to the selecting step when there are two clusters which are not handled by the clustering step;
   a step of returning to the cluster pair generating and calculating step when a terminate condition for the logic cell placement method is not satisfied.

4. A logic cell placement method according to claim 3, wherein a connection strength of each cluster pair, the number of terminals of each cluster pair, the number of wiring which can be wired on the logic cells of each cluster pair, and a sum of values increasing in accordance with an increase of the area in each cluster pair are used as the estimate functions based on the congestion rate of the number of wirings.

* * * * *